United States Patent [19]

Sawagata

[11] 4,183,016
[45] Jan. 8, 1980

[54] PARALLEL ANALOG-TO-DIGITAL CONVERTER WITH INCREASED RESOLUTION

[75] Inventor: Kiyoshi Sawagata, Yokohama, Japan

[73] Assignee: Sony Corp., Tokyo, Japan

[21] Appl. No.: 940,764

[22] Filed: Sep. 8, 1978

[30] Foreign Application Priority Data

Sep. 8, 1977 [JP] Japan ................ 52-107236

[51] Int. Cl.² .................... H03K 13/175
[52] U.S. Cl. ............... 340/347 AD; 307/360; 307/361
[58] Field of Search ......... 340/347 M, 347 AD; 324/99 D; 307/360, 361; 358/133, 138; 325/38 R

[56] References Cited

U.S. PATENT DOCUMENTS

| 3,656,152 | 4/1972 | Gundersen | 340/347 AD |
| 3,949,170 | 4/1976 | Shionoya | 340/347 AD X |

*Primary Examiner*—Thomas J. Sloyan
*Attorney, Agent, or Firm*—Lewis H. Eslinger; Alvin Sinderbrand

[57] ABSTRACT

An analog-to-digital converter of the type including a sample-and-hold circuit for sampling an analog signal during predetermined cycles to produce periodically sampled voltages, a source of reference voltages for supplying plural quantizing voltages having a quantizing voltage step $\Delta V$, a plurality of voltage comparators for receiving each sampled voltage and the plural quantizing voltages to compare the sampled voltage to respective ones of the quantizing voltage for determining the level of the sampled voltage relative to the quantizing voltages, and an encoder responsive to the voltage comparators to produce a plural-bit code as a function of the determined sampled voltage level. The analog-to-digital converter includes the improvement comprised of an offset supply operative to shift either the sampled voltage level or the quantizing voltages by an offset amount during each sampling cycle, a detector coupled to receive the least significant bit in the plural-bit code produced by the encoder for detecting whether this least significant bit changes in response to the operation of the offset voltage source, and an output circuit for deriving an output digital signal formed of the plural-bit code produced by the encoder and an additional bit derived from the detector.

9 Claims, 12 Drawing Figures

PARALLEL ANALOG-TO-DIGITAL CONVERTER WITH INCREASED RESOLUTION

BACKGROUND OF THE INVENTION

This invention relates to an analog-to-digital converter and, more particularly, to a parallel-type analog-to-digital converter which exhibits a high converting speed yet is formed of less component parts and thus is far more simplified than parallel-type analog-to-digital converters heretofore known.

Analog-to-digital converters, hereinafter referred to as A/D converters, generally are of two distinct types. A series-type A/D converter is of relatively simple construction in that it includes a small number of components. The analog signal is digitally encoded to produce a series of plural bits. However, this series-type A/D converter suffers from a relatively slow operating speed which is necessary in order to obtain all of the serial bits.

In the parallel-type A/D converter, the problem of slow operating speed is avoided. In such an A/D converter, the analog signal is converted to parallel plural bits in one operation. Thus, for an n-bit signal, the parallel-type converter operates at 1/n the speed of the series-type converter. However, in order to attain this high operating speed, the parallel-type A/D converter is formed of a large number of components, and thus of relatively complex construction.

In one form of parallel-type A/D converter, the input analog signal is sampled, and this sample is compared to each of a plurality of quantizing voltage levels. A digital code is produced corresponding to the highest quantizing level which is exceeded by the sampled voltage. To accomplish this, a number of voltage comparators must be provided, each comparator being supplied with a separate, discrete quantizing voltage level as well as with the sampled analog signal. It may be appreciated that, if an analog signal is to be converted into an n-bit digital code, then $2^n-1$ quantizing levels must be provided. This means that $2^n-1$ separate voltage comparators are needed. For a 4-bit code, fifteen voltage comparators must be used to quantize the analog signal. Because of the large number of components, and particularly voltage comparators, which are needed for a parallel-type A/D converter, such converters generally are used only if the digitally encoded signal contains a relatively small number of bits or if high conversion speed is of paramount importance. Accordingly, parallel-type A/D converters have been used for PCM communication applications and in transient signal recorders, as typical examples.

There is, therefore, a need for an A/D converter having a conversion speed on the order of the aforementioned parallel-type converters, yet is far less simplified, and thus less expensive.

OBJECTS OF THE INVENTION

Therefore, it is an object of the present invention to provide an improved A/D converter of the parallel-type.

Another object of this invention is to provide an improved parallel-type A/D converter having a conversion speed on the order of prior art parallel-type converters, yet is far less complex, and thus less expensive.

A further object of this invention is to provide a parallel-type A/D converter for converting an analog signal to a plural-bit signal by using a number of comparators to compare a sampled analog level to a plurality of quantizing levels, yet which uses approximately one-half the number of quantizing levels and comparators that heretofore had been necessary to obtain such a plural-bit signal.

An additional object of this invention is to provide a parallel-type A/D converter which encodes an analog signal into an n-bit digital code while using only $2^{n-1}-1$ quantizing levels.

Various other objects, advantages and features of the present invention will become readily apparent from the ensuing detailed description, and the novel features will be particularly pointed out in the appended claims.

SUMMARY OF THE INVENTION

In accordance with this invention, an analog-to-digital converter is comprised of a sample-and-hold circuit for sampling an analog signal during predetermined sampling cycles to produce periodically sampled voltages, each sampled voltage being compared in a plurality of voltage comparators to quantizing voltages, the quantizing voltages having a quantizing voltage step $\Delta V$. An encoder is coupled to the voltage comparators to produce a plural-bit code as a function of the sampled voltage level determined by the voltage comparators. A source of offset voltage is operative to shift either the sampled voltage level or the quantizing voltage levels, relative to each other, during each sampling cycle. The least significant bit in the plural-bit code produced by the encoder is detected to ascertain whether its value changes in response to the operation of the source of offset voltage. An output circuit derives an output digital signal formed of the plural-bit code produced by the encoder plus an additional bit derived from the detector.

BRIEF DESCRIPTION OF THE DRAWINGS

The following detailed description, given by way of example, will best be understood in conjunction with the accompanying drawings in which.

DETAILED DESCRIPTION OF A PREFERRED EMBODIMENT

Figure 1:
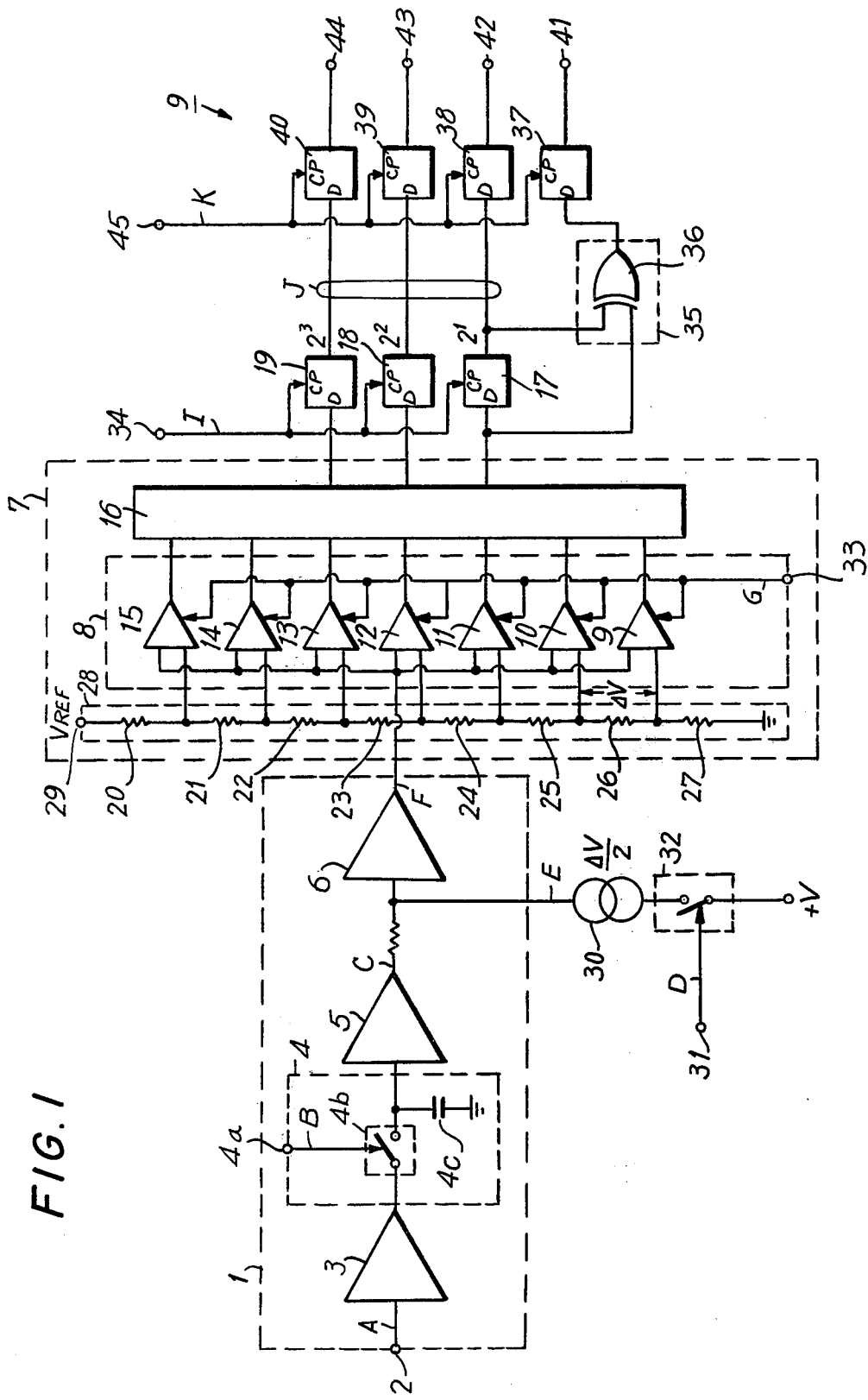
FIG. 1 is a partial block, partial schematic diagram of one embodiment of the present invention.

Referring to FIG. 1, the improved analog-to-digital (A/D) converter is shown as being capable of converting an input analog signal, supplied to an input terminal 2, to a 4-bit digital signal provided at output terminals 41–44. As will be readily appreciated, the principles of the present invention are equally applicable to an A/D converter capable of converting an analog signal to a digital signal constituted by any desired number of bits. The illustrated A/D converter, which is of the parallel-type, includes a sampling circuit 1, an encoding circuit 7 and an output circuit 9. Sampling circuit 1 includes an amplifier 3, a sample-and-hold circuit 4 and buffer amplifiers 5 and 6. Amplifier 3 is coupled to input terminal 2 to receive the analog signal and supply that analog signal to the sample-and-hold circuit 4.

The sample-and-hold circuit is comprised of a sampling switch 4b, adapted to be closed in response to a sampling pulse supplied to sample control input 4a. The output of sampling switch 4b is coupled to a capacitor 4c such that when switch 4b is closed, capacitor 4c is rapidly charged to the level of the analog signal then present at input terminal 2.

The output of sample-and-hold circuit 4 is supplied through buffer amplifiers 5 and 6, connected in cascade, to encoding circuit 7. The encoding circuit includes an n-bit encoder 16, for example, a 3-bit encoder, having $2^n-1$ inputs, each input being connected to the output of a respective voltage comparator 9–15 inclusive. Encoding circuit 7 also includes a source of quantizing voltages 28 which is formed of a string of voltage-divider resistors 20–27 connected between a source of reference potential $V_{REF}$ and ground. Reference potential $V_{REF}$ is supplied to the voltage divider resistors via a reference input terminal 29. Preferably, the voltage divider resistors are of equal resistance value so that the quantizing voltage produced at the junction of two adjacent resistors differs from the quantizing voltage derived at the junction of the next two adjacent resistors by a quantizing step $\Delta V$. More particularly, the lowest quantizing level $\Delta V$ is produced across resistor 27 and is supplied to one input of voltage comparator 9. The next higher quantizing level $2\Delta V$ is produced at the junction of resistors 25 and 26, that is, across the series-connected resistors 26 and 27, and is supplied to voltage comparator 10. The next higher quantizing level $3\Delta V$ is produced at the junction defined by resistors 24 and 25 and is supplied to voltage comparator 11. The remaining quantizing voltage levels are similarly produced and supplied to the remaining voltage comparators. Hence, the quantizing level supplied to one voltage comparator, for example, voltage comparator 12, differs from the quantizing level supplied to either of its adjacent voltage comparators, such as voltage comparators 11 or 13, by the incremental quantizing step $\Delta V$.

The remaining inputs of voltage comparators 9–15 all are connected in common to the output of buffer amplifier 6 for receiving the sampled voltage level derived from the input analog signal by sample-and-hold circuit 4. Each of these voltage comparators is of the so-called latching type and includes a latching input connected to a latching control terminal 33. That is, when a latching pulse, to be described, is supplied to terminal 33, the output of each voltage comparator is latched, or temporarily stored, until the occurrence of the next latching pulse. As a further example thereof, even voltage comparator may be of the type which produces merely a relatively higher signal when the sampled analog voltage supplied thereto exceeds the quantizing voltage level supplied thereto, and produces a relatively lower level signal when the sampled analog voltage is less than the quantizing voltage.

In view of the foregoing description of voltage comparators 9–15, depicted as comprising a comparator stage 8, it may be appreciated that if the sampled voltage level is, for example, greater than $4\Delta V$ but less than $5\Delta V$, the outputs of comparators 9, 10, 11 and 12 will be at a relatively higher level, but the outputs of comparators 13, 14 and 15 will be at a relatively lower level. When a latching pulse is supplied to terminal 33, these outputs are "latched", or temporarily stored by these comparators. If the sampled voltage level now falls so as to be less than $4\Delta V$ but greater than $3\Delta V$, then, in response to the next latching pulse, relatively higher levels are provided at the outputs of voltage comparators 9, 10 and 11, and relatively lower voltage levels are provided at the outputs of voltage comparators 12, 13, 14 and 15.

Encoder 16 is a conventional 3-bit encoder and functions to convert the latched signals supplied thereto from comparator circuit 8 to a corresponding 3-bit code. If the higher level produced at the output of a voltage comparator is designated H, and if the lower level produced at the output thereof is designated L, then encoder 16 functions in accordance with the following table to produce a 3-bit code:

TABLE

| COMPARATOR | | | | | | | ENCODERS OUTPUT | | |
|---|---|---|---|---|---|---|---|---|---|
| 9 | 10 | 11 | 12 | 13 | 14 | 15 | | | |
| H | L | L | L | L | L | L | 0 | 0 | 1 |
| H | H | L | L | L | L | L | 0 | 1 | 0 |
| H | H | H | L | L | L | L | 0 | 1 | 1 |
| H | H | H | H | L | L | L | 1 | 0 | 0 |
| H | H | H | H | H | L | L | 1 | 0 | 1 |
| H | H | H | H | H | H | L | 1 | 1 | 0 |
| H | H | H | H | H | H | H | 1 | 1 | 1 |

It is seen that the 3-bit code produced by encoder 16 is a parallel code. The respective outputs of this encoder are connected to the data inputs of D-type triggerable flip-flop circuits 17, 18 and 19. Each of these flip-flop circuits includes a trigger input CP connected in common to an input terminal 34 to receive a trigger pulse supplied thereto. It is appreciated that, in response to this trigger pulse, the 3-bit parallel code produced at the output of encoder 16 is stored in triggerable flip-flop circuits 17, 18 and 19.

In accordance with this invention, the illustrated encoding circuit 7, although of a type normally used to produce a 3-bit code, it used in accordance with the following teachings to produce a 4-bit code. An offset voltage supply circuit is comprised of a source of offset voltage 30 and an energizing switch 32. Energizing switch 32 has one input coupled to a source of operating potential $+V$ and also includes a control input coupled to a control terminal 31. When a suitable control signal is applied to control terminal 31, switch 32 is closed so as to supply the energizing potential to the source of offset voltage, thereby energizing this source to supply an offset voltage $\Delta V/2$ to the cascade connection of buffer amplifiers 5 and 6. That is, when switch 32 is closed, an offset voltage $\Delta V/2$ is superimposed onto the sampled voltage level. As will become apparent, if desired, the offset voltage may, alternatively, be superimposed onto the analog signal directly and thus may be applied to the input of amplifier 3. In the example shown in FIG. 1, the offset voltage is a positive voltage. Hence, when switch 32 is closed, the sampled voltage level is increased by an amount $\Delta V/2$. As may be appreciated, this incremental increase in the sampled voltage level may be sufficient such that the sampled level supplied to comparator circuit 8 now exceeds the next higher quantizing level which had not been exceeded in the absence of the offset voltage. As is recognized from the table set out hereinabove, if a sampled voltage level had not exceeded a particular quantizing level in the absence of the offset voltage, then an indication that this quantizing level is exceeded when the offset voltage is supplied is provided by a change in state of the least significant bit produced by encoder 16.

A detector 35 is provided to detect whether the least significant bit in the 3-bit encoded signal produced by encoder 16 changes its value when the offset voltage $\Delta V/2$ is superimposed onto the sampled voltage level.

Detector 35 is comprised of an exclusive OR gate 36 having one input coupled to receive the least significant bit produced by encoder 16, and another input coupled to receive the least significant bit stored in flip-flop circuit 17. In accordance with the well-known operation of an exclusive OR gate, if the least significant bit provided at the output of encoder 16 is equal to the least significant bit stored in flip-flop circuit 17, then a binary "0" is produced at the output of exclusive OR gate 36. This, of course, means that no change has occurred in the least significant bit produced by the encoder in response to the superposition of the offset voltage onto the sampled voltage level. However, if the least significant bit produced by encoder 16 differs from the least significant bit stored in flip-flop circuit 17, then a binary "1" is produced by the exclusive OR gate. This represents that the least significant bit at the encoder output has undergone a change in value in response to the offset voltage superimposed onto the sampled voltage level.

Output circuit 9 includes four flip-flop circuits 37–40, respectively. Flip-flop circuit 40 is coupled to the output of flip-flop circuit 19 to store the most significant bit therein. This, of course, is the most significant bit produced by encoder 16. Flip-flop circuit 39 is coupled to the output of flip-flop circuit 18 to store the next most significant bit. Flip-flop circuit 38 is coupled to the output of flip-flop circuit 17 to store the least significant bit initially provided by encoder 16. Flip-flop circuit 37 stores either the binary "1" or binary "0" produced by exclusive OR gate 36, depending upon whether the least significant bit produced by encoder 16 undergoes a change in response to the superimposition of the offset voltage onto the sampled voltage level. The outputs of flip-flop circuits 37–40 are coupled to output terminals 41–44 to supply a 4-bit code thereto. Each of flip-flop circuits 37–40 is a triggerable D-type flip-flop circuit having a trigger input CP connected in common to an input terminal 45 to receive a trigger pulse supplied thereto.

Figure 2A:
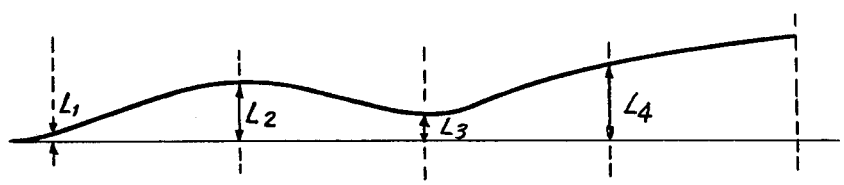
FIGS. 2A–2K are waveform diagrams which are useful in understanding the operation of the embodiment shown in FIG. 1.
Figure 2B:
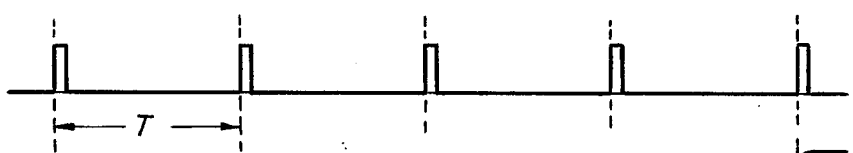

The manner in which the parallel-type A/D converter shown in FIG. 1 operates to produce a 4-bit code now will be described with reference to the waveform diagrams illustrated in FIGS. 4A–4K. Let it be assumed that the analog signal applied to input terminal 2 appears as shown by the waveform in FIG. 2A. For convenience, the signals which are produced by the various circuits of FIG. 1 are identified with reference letters corresponding to the waveform diagram which illustrates that signal. Accordingly, analog signal A is amplified by amplifier 3 and sampled in sample-and-hold circuit 4 in response to the periodic sampling pulses B shown in FIG. 2B. These sampling pulses are separated by the period T.

Figure 2C:
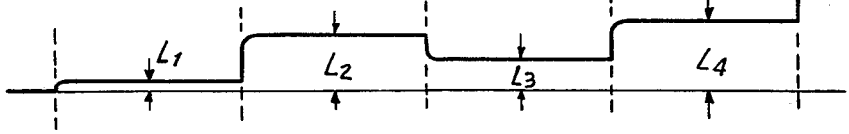

In response to the first sampling pulse, the level of analog signal A, assumed herein to be equal to a level $L_1$, is sampled and stored across capacitor 4c. This stored level $L_1$ is supplied by amplifier 5 as the sampled level C, shown in FIG. 2C. At the next sampling pulse, it is assumed that analog signal A has a level $L_2$, and the sampled voltage level shown in FIG. 2C correspondingly increases, as illustrated. At the next sampling time, the analog signal level is reduced to $L_3$, and this level is sampled, stored across capacitor 4c and supplied by amplifier 5. Then, at the next sampling time, the level of the analog signal, which is assumed to be equal to $L_4$, is sampled and supplied by amplifier 5, as shown in FIG. 2C.

Figure 2D:
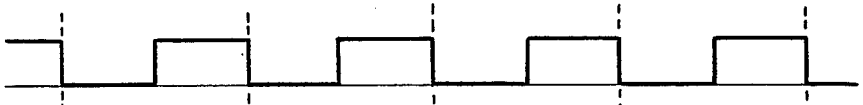
Figure 2E:
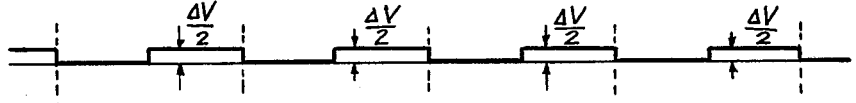

Let it be assumed that the control pulse applied from input terminal 31 to switch 32 is as shown in FIG. 2D. This rectangular pulse signal is at a relatively lower level during the first half portion of the sampling period T, and undergoes a positive transition to a relatively higher level during the next half portion of the sampling period. The higher level of switch control pulse D closes switch 32 so as to periodically energize the source 30 of offset voltage $\Delta V/2$. Consequently, the output offset voltage E produced by source 30 is as shown in FIG. 2E.

Figure 2F:
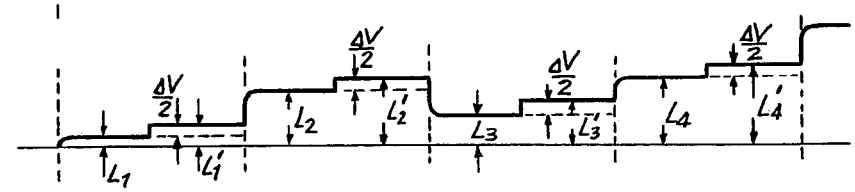

The offset voltage $\Delta V/2$ (FIG. 2E) is superimposed onto the sampled voltage level C produced at the output of amplifier 5. These superimposed signals are provided at the output of amplifier 6 as shown in FIG. 5F. It is appreciated that, during the first sampling period, the superimposed signals F admit of a level equal only to the sampled voltage level $L_1$. During the next half portion of the sampling period, that is, during the interval that the offset voltage $\Delta V/2$ is produced, the level of the superimposed signal is increased from $L_1$ to $L_1 + \Delta V/2$. Similarly, during the next sampling period, the level of the superimposed signals is equal only to the sampled voltage level $L_2$ during the first half portion, and then is equal to $L_2 + \Delta V/2$. FIG. 2F illustrates the waveform of the superimposed signals F during subsequent sampling periods.

Figure 2G:
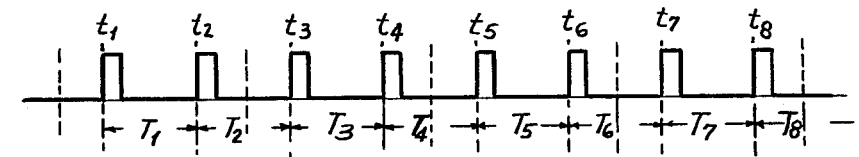
Figure 2H:
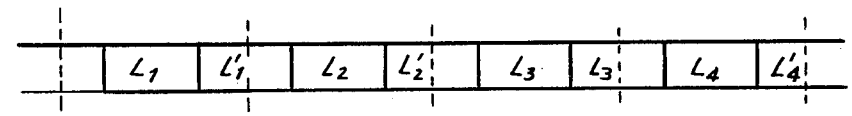

A source of latching pulses (not shown) supplies periodic latching pulses G, illustrated in FIG. 2G, to input terminal 33. It is seen that the frequency of these latching pulses is twice the frequency of the sampling pulses. Moreover, each latching pulse occurs midway during each half portion of a sampling period. Accordingly, in response to the first latching pulse, which occurs at time $t_1$, comparator circuit 8 latches to the appropriate value, shown above in the preceding table, depending upon the sampled voltage level $L_1$. FIG. 2H represents that, in response to the latching pulse which occurs at time $t_1$, voltage comparators 9–15 produce a quantized version of the sampled voltage level $L_1$. Then, in response to the next latching pulse $t_2$, since the sampled voltage level now has been increased by the offset voltage $\Delta V/2$, FIG. 2H represents that the output of voltage comparators 9–15 corresponds to a quantized version of this increased sampled voltage level, designated $L'_1$. At the next latching pulse $t_3$, the sampled voltage level $L_2$ is quantized by voltage comparators 9–15 to the quantized version $L_2$. Then, at latching pulse time $t_4$, since the sampled voltage level $L_2$ has been increased by the superimposed offset voltage $\Delta V/2$, the voltage comparators now produce the quantized version of this modified sampled voltage level, designated $L'_2$. The foregoing operation is repeated during the first and second half portions of each succeeding sampling pulse period. That is, during the first half portion of the sampling pulse period, comparator circuit 8 is latched to produce the quantized representation of the sampled voltage level, and during the next half portion of the sampling pulse period, the comparator circuit is latched to represent the quantized version of the sampled voltage level plus the superimposed offset voltage $\Delta V/2$.

Figure 2I:
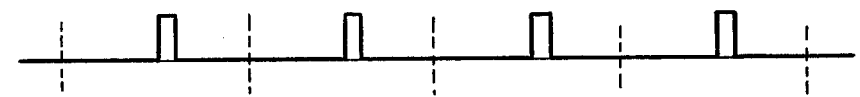
Figure 2J:
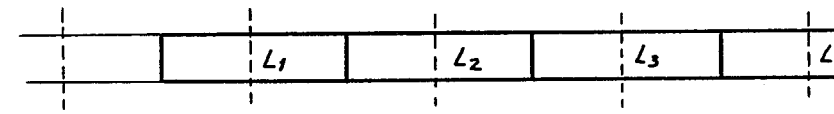

Encoder 16 produces the 3-bit encoded version of the quantized representation supplied thereto by comparator circuit 8. This 3-bit encoded signal is stored in triggerable flip-flop circuits 17, 18 and 19 in response to each trigger pulse I supplied thereto from input terminal 34. As shown in FIG. 2I, trigger pulses I are generated during the period that comparator circuit 8 is latched to the quantized representation of the sampled voltage level. Thus, in response to trigger pulses I, flip-flop circuits 17, 18 and 19 store the 3-bit code corresponding to the quantized representation of sampled voltage levels $L_1$, $L_2$, $L_3$ and so on. That is, flip-flop circuits 17–19 store the 3-bit coded version of the sampled analog signal. It is appreciated that, in the absence of the source of offset voltage 30, sampling circuit 1, encoding circuit 7 and the three triggerable flip-flop circuits 17–19 function in the normal manner to produce an n-bit code while using $2^n - 1$ quantizing levels and voltage comparators. The contents of flip-flop circuits 17–19 is shown in FIG. 2J, which represents the 3-bit code produced by encoder 16 in response to the quantized representation of the sampled voltage level.

Figure 2K:
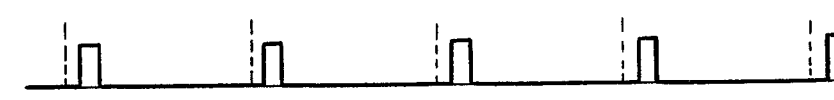

It is appreciated that, at latching pulse times $t_2$, $t_4$, . . . the quantized representation of the superimposed sampled voltage level and offset voltage supplied to encoder 16 may result in a different 3-bit code at the output of the encoder. However, since flip-flop circuits 17–19 are triggered only during the times that the encoder produces the 3-bit code corresponding to the quantized sampled voltage level without the addition of the offset voltage thereto, the contents of flip-flop circuits 17–19 are not disturbed even if the encoded output of encoder 16 changes. If the least significant bit of the output of encoder 16 changes in response to the quantized representation of the superimposed sampled voltage level and offset voltage supplied thereto, then this least significant bit will differ from the least significant bit which had been stored in flip-flop circuit 17. Such a difference results in a binary "1" produced by exclusive OR gate 36. This binary "1", together with the previously stored 3-bit code in flip-flop circuits 17–19, are set into flip-flop circuits 37–40, respectively, in response to trigger pulses K (FIG. 2K) supplied to the latter flip-flop circuits. It is appreciated that trigger pulses K are generated during the time that comparator circuit 8 is latched to the superimposed quantized representation of the sampled voltage level and the added offset voltage. Thus, flip-flop circuits 38, 39 and 40 store the 3-bit code which has been stored in flip-flop circuits 17, 18 and 19, respectively, and which had been produced by encoder 16 in response to the quantized representation of the sampled voltage levels $L_1$, $L_2$, . . . Flip-flop circuit 37 stores a binary "1" only if the addition of the superimposed offset voltage $\Delta V/2$ is sufficient to change the quantized representation of the sampled voltage level. If the addition of this offset voltage is not sufficient to change the quantized representation of the sampled voltage level, that is, if the least significant bit produced by encoder 16 at times $t_2$, $t_4$, . . . is equal to the least significant bit which had been produced during times $t_1$, $t_3$, . . . , then flip-flop circuit 37 stores a binary "0".

In the embodiment shown in FIG. 1, the quantizing voltage levels are supplied through eight series-connected voltage-divider resistors 20–27. Hence, each quantized voltage level may be represented as $N/8 \cdot V_{REF}$, wherein N = 1, 2, . . . 7. It is, therefore, appreciated that the quantizing voltage step $V = 1/8 \; V_{REF}$. Since the offset voltage is equal to $\Delta V/2$, it is seen that this offset voltage is equal to $1/16 \; V_{REF}$. If the sampled voltage level is represented as L, then, in the embodiment shown in FIG. 1, it may be seen that the least significant bit provided at the output of encoder 16 will change in response to the superposition of the offset voltage to the sampled voltage level if $(N - 1/8 + 1/16) \cdot V_{REF} < L < N/8 \cdot V_{REF}$. Conversely, the least significant bit at the output of encoder 16 will not change if $(N - 1/8 + 1/16) \cdot V_{REF} > L \geq N - 1/8 \cdot V_{REF}$. In the foregoing mathematical expressions, the denominators 8 and 16 are used because it has been assumed that the quantizing voltage levels are derived from eight series-connected voltage-divider resistors. If, for example, sixteen such resistors are used, resulting in a 4-bit encoded signal produced by encoder 16, then the denominators in the foregoing mathematical expressions will be 16 and 32, respectively.

It is appreciated that, in the resultant 4-bit code produced by flip-flop circuits 37–40, the bit values $2^0$, $2^1$, $2^2$, $2^3$ are stored in flip-flop circuits 37, 38, 39 and 40, respectively. In view of the foregoing discussion, encoder 16 is adapted to supply bit values $2^1$, $2^2$ and $2^3$ to flip-flop circuits 17, 18 and 19, respectively, in response to the sampled voltage level produced by sampling circuit 4.

Thus, it is seen that, in accordance with the present invention, a parallel-type A/D converter is provided wherein an n-bit code is produced while requiring only $2^{n-1} - 1$ quantizing levels, and thus only $2^{n-1} - 1$ voltage comparators. Stated otherwise, the number of component parts which are needed to produce the n-bit code in accordance with the present invention can be reduced by about one-half with respect to the number of component parts needed by prior art parallel-type A/D converters. Alternatively, if the same number of voltage comparators and quantizing levels is to be used with this invention as has been used in prior art parallel-type A/D converters, an additional bit in the resultant digital code can be provided, thus improving the resolution of the A/D converter.

It is recognized that the time required for an analog-to-digital conversion includes the time required for two separate latching operations of comparator circuit 8 (shown by the latching pulses G in FIG. 2G). This conversion time is far less than that required by conventional series-type A/D converters. For example, if an analog signal is to be converted to an 8-bit digital signal, and if it is assumed that the response time of the illustrated voltage comparators is about 10 n sec, then a series-type A/D converter requires 420 n sec to complete this conversion. However, in accordance with the teachings of the present invention, the analog signal can be converted to the 8-bit digital signal in about 100 n. sec.

While the present invention has been particularly shown and described with reference to a preferred embodiment thereof, it should be readily apparent to those of ordinary skill in the art that various changes and modifications in form and details can be made without departing from the spirit and scope of the invention. For example, the offset voltage $\Delta V/2$ can be supplied either to the sampled voltage level, as illustrated in FIG. 1, or to the input analog signal supplied to input terminal 2. As a further modification, the quantizing voltages all can be increased by the offset voltage level $\Delta V/2$ by supplying this offset voltage to the voltage-divider resistors included in block 28. Also, the teachings of the present invention can be applied to the so-called series-parallel-type /A/D converter which would improve the resolution of that converter without increasing the number of quantizing levels or voltage comparators in the parallel-converter stage thereof. Still further, although the sampled voltage level has been increased by the offset voltage once during each sampling period T, a third superposition of an offset voltage may be added, if desired. For example, if, after the sampled voltage level is increased by the offset voltage $\Delta V/2$, the output of exclusive OR gate 36 is a binary "0", then another addition of an offset voltage equal to $(\frac{1}{2}+\frac{1}{4})\Delta V$ may be superimposed onto, for example, superimposed signal F. However, if exclusive OR gate 36 produces a binary "1" after the first superposition of the offset voltage, then a second superposition of an offset voltage equal to $\frac{1}{4}\Delta V$ may be provided. With these additional superpositions, yet another additional bit may be derived in the output digital code. It is intended that the appended claims include the foregoing as well as other such changes and modifications.

What is claimed is:

1. An analog-to-digital converter comprising sample-and-hold means for sampling an analog signal during predetermined sampling cycles to produce periodically sampled voltages; reference voltage supply means for supplying plural quantizing voltages having a quantizing voltage step $\Delta V$; a plurality of voltage comparators for receiving each sampled voltage and said plural quantizing voltages to compare said sampled voltage to each of said quantizing voltages for determining the level of said sampled voltage relative to said quantizing voltages; encoding means responsive to said voltage comparators to produce a plural-bit code as a function of the determined sampled voltage level; offset voltage supply means operative to shift the sampled voltage level relative to said quantizing voltages during each sampling cycle; detecting means coupled to receive the least significant bit in said plural-bit code produced by said encoding means for detecting whether said least significant bit changes in response to the operation of said offset voltage supply means; and output means for deriving an output digital signal formed of said plural-bit code produced by said encoding means and an additional bit derived from said detecting means.

2. The analog-to-digital converter of claim 1, wherein said offset supply means supplies an offset voltage to be superimposed onto said sampled voltage.

3. The analog-to-digital converter of claim 1, wherein said offset supply means supplies an offset voltage to be superimposed onto said analog signal.

4. The analog-to-digital converter of claim 1, wherein said offset supply means supplies an offset voltage to be superimposed onto each of said quantizing voltages supplied to said voltage comparators.

5. The analog-to-digital converter of claim 2, 3 or 4 wherein said offset voltage is equal to $\Delta V/2$.

6. The analog-to-digital converter of claim 1, wherein said encoding means produces an n-bit code and wherein said output means comprises a first stage of n storage means for storing said n-bit code and a second stage of n+1 storage means for receiving and storing the n-bit bode from said first stage and for receiving and storing an additional bit whose value is a function of whether said least significant bit in the code produced by said encoding means changes in response to said operation of said offset voltage supply means.

7. The analog-to-digital converter of claim 6 wherein said first stage is comprised of n triggerable flip-flop means coupled to said encoding means: and a source of trigger pulses for triggering said n triggerable flip-flop means in said first stage to store the n-bit code produced by said encoding means prior to the operation of said offset voltage supply means.

8. The analog-to-digital converter of claim 7 wherein said second stage is comprised of n+1 triggerable flip-flop means, respective ones of which are coupled to said n flip-flop means in said first stage and to said detecting means; and a second source of trigger pulses for triggering said n+1 triggerable flip-flop means in said second stage to store the n-bit code stored in said first stage plus said additional bit subsequent to the operation of said offset voltage supply means.

9. The analog-to-digital converter of claim 6, 7 or 8 wherein said detecting means comprises an exclusive-OR gate having one input coupled to receive the least significant bit in the code produced by said encoding means and another input coupled to receive the least significant bit in the code stored in said first stage.

* * * * *